US007382116B2

(12) United States Patent
Endo et al.

(10) Patent No.: US 7,382,116 B2
(45) Date of Patent: Jun. 3, 2008

(54) SEMICONDUCTOR DEVICE CONFIGURED TO CONTROL A GATE VOLTAGE BETWEEN A THRESHOLD VOLTAGE AND GROUND

(75) Inventors: Koichi Endo, Tokyo (JP); Morio Takahashi, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 11/061,840

(22) Filed: Feb. 22, 2005

(65) Prior Publication Data

US 2006/0087300 A1 Apr. 27, 2006

(30) Foreign Application Priority Data

Oct. 25, 2004 (JP) ............................ 2004-309663

(51) Int. Cl.
*G05F 1/00* (2006.01)
*H03K 17/284* (2006.01)

(52) U.S. Cl. ...................... 323/282; 327/109; 327/112; 323/289; 323/223

(58) Field of Classification Search ................ 323/282, 323/17, 289, 223; 363/17, 127; 327/112, 327/110, 109
See application file for complete search history.

(56) References Cited

U.S. PATENT DOCUMENTS 4,259,600 A * 3/1981 Fellrath et al. ............. 327/109
5,365,118 A * 11/1994 Wilcox ....................... 327/109
5,583,460 A * 12/1996 Dohi et al. ................. 327/126
5,894,243 A * 4/1999 Hwang ........................ 327/540
5,929,665 A * 7/1999 Ichikawa et al. ........... 327/109
6,107,844 A * 8/2000 Berg et al. .................. 327/110
6,166,935 A * 12/2000 Tokashiki et al. ............. 363/98
6,392,908 B2 * 5/2002 Miyazaki et al. ............. 363/98
6,605,980 B2 * 8/2003 Haeusser-Boehm ......... 327/531
6,737,842 B2 * 5/2004 Bai et al. ..................... 323/282
6,781,853 B2 * 8/2004 Xu et al. ................. 363/21.06
6,831,847 B2 * 12/2004 Perry ...................... 363/21.06
6,958,592 B2 * 10/2005 Chapuis ....................... 323/246
6,992,520 B1 * 1/2006 Herbert ....................... 327/377
2007/0040542 A1 * 2/2007 Cortigiani et al. .......... 323/312

FOREIGN PATENT DOCUMENTS

CN 1320298 A 10/2001
JP 2003-134802 5/2003

* cited by examiner

*Primary Examiner*—Jeffrey L. Sterrett
*Assistant Examiner*—Harry Behm
(74) *Attorney, Agent, or Firm*—Oblon, Spivak, McClelland, Maier & Neustadt, P.C.

(57) ABSTRACT

A pair of upper and lower semiconductor switching elements can switch between the conductive state and the non-conductive state when control voltages vary. A controller controls the levels of the control voltages to alternately turn on the upper and lower semiconductor switching elements. The controller controls the absolute value of the second control voltage of the lower semiconductor switching element so as to reach a mean voltage before and after the time of transition between the conductive state and the non-conductive state of the upper semiconductor switching element. The mean voltage is lower than the absolute value of a threshold voltage and higher than a reference voltage.

20 Claims, 16 Drawing Sheets

SEMICONDUCTOR DEVICE CONFIGURED TO CONTROL A GATE VOLTAGE BETWEEN A THRESHOLD VOLTAGE AND GROUND

CROSS-REFERENCE TO PRIOR APPLICATION

This application is based upon and claims the benefit of priority from the prior Japanese Patent Application No. 2004-309663, filed on Oct. 25, 2004, the entire content of which is incorporated herein by reference.

BACKGROUND OF THE INVENTION

1. Field of the Invention

The present invention relates to a semiconductor device including upper and lower semiconductor switching elements, which are connected in totem pole and turned on alternately.

2. Description of the Related Art

A DC-DC converter is known as a device for converting a DC input voltage to a DC output voltage of a different level. The DC-DC converter generally comprises an upper semiconductor switching element and a lower semiconductor switching element connected in serial or so-called totem pole between an input voltage and a reference voltage. It also comprises an inductor connected from a node between these two semiconductor switching elements to a load. The upper semiconductor switching element may comprise a transistor such as a MOSFET or an IGBT. The lower semiconductor switching element may comprise a diode. The use of the diode causes a problem associated with a large power loss because it has a large forward voltage. Therefore, the lower semiconductor switching element may often comprise a voltage-controlled semiconductor element, such as a MOSFET, having low power consumption on conduction and capable of conduction controlling by a gate voltage in synchronous with conduction/non-conduction of the upper semiconductor switching element.

If both the upper and lower semiconductor switching elements comprise voltage-controlled semiconductor elements such as MOSFETs, it is required to prevent a through current from flowing through the upper and lower semiconductor switching elements when they are made conductive at the same time due to logic in the controller or noise. Therefore, between a conductive period of only the upper semiconductor switching element and a conductive period of only the lower semiconductor switching element, a period (dead time) is set to make both the transistors non-conductive. The dead time is determined to have such a length that prevents both the transistors from entering the state of conduction at the same time even if outer perturbation like a noise changes the time to turn on/off both the transistors. The dead time, if it is determined excessively longer, causes an increase in power loss. Therefore, various proposals have been made to minimize the required length of the dead time. For example, a publication of JP-A 2003-134802 discloses a circuit, which includes a comparator that detects if a control voltage applied to one of semiconductor switching elements lowers below a threshold voltage. The output from the comparator is employed to switch the conduction state of the other of the semiconductor switching elements (paragraphs [0016]-[0019], FIGS. 1 and 6).

In the circuit disclosed in the publication, however, after the comparator detects that the control voltage to one of the upper or lower semiconductor switching elements lowers below the threshold voltage, the control voltage to the other of the upper or lower semiconductor switching elements is elevated up to the threshold voltage or higher to switch the other from the non-conductive state to the conductive state. Accordingly, procedures of detection by the comparator and transition of the control voltage after the detection are essentially required and the dead time still exists.

SUMMARY OF THE INVENTION

In one aspect the present invention provides a semiconductor device, which comprises an upper semiconductor switching element having a first control terminal to receive a first control voltage applied thereto and operative to switch between the conductive state and the non-conductive state when the first control voltage varies; a lower semiconductor switching element serially connected to the upper semiconductor switching element at a node, and having a second control terminal to receive a second control voltage applied thereto and operative to switch between the conductive state and the non-conductive state when the second control voltage varies; and a controller operative to control levels of the first control voltage and the second control voltage to alternately turn on the upper semiconductor switching element and the lower semiconductor switching element. The controller controls the absolute value of the second control voltage so as to reach a mean voltage lower than the absolute value of a threshold voltage of the lower semiconductor switching element and higher than a reference voltage and applies the mean voltage to the second control terminal during a transition period present before and after the time of transition between the conductive state and the non-conductive state of the upper semiconductor switching element.

DETAILED DESCRIPTION OF THE INVENTION

Figure 1:
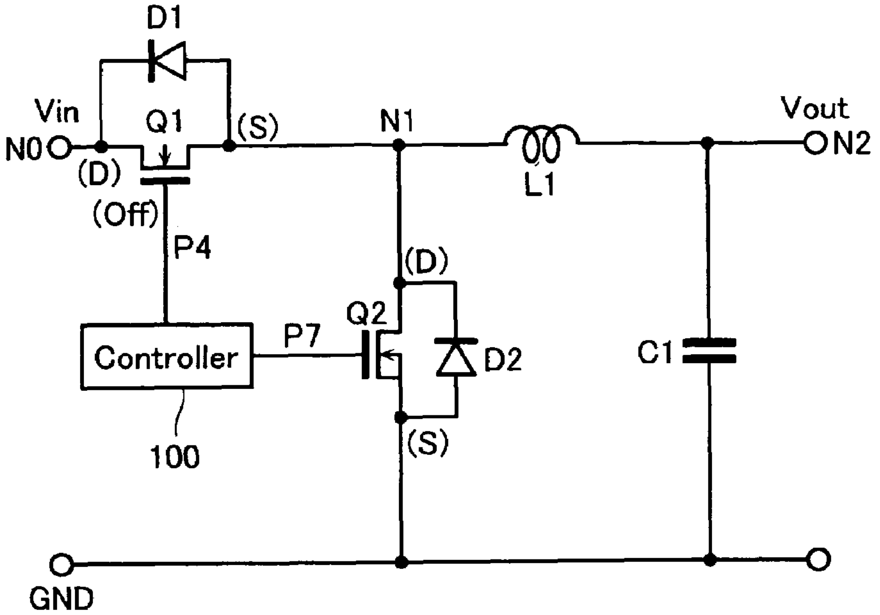
FIG. 1 is a circuit diagram showing a basic configuration of a DC-DC converter, which can accept application of the embodiments of the present invention.

The embodiments of the present invention will now be described with reference to the drawings. FIG. 1 is a circuit diagram showing a basic configuration of a DC-DC converter, which can accept application of the embodiments of the present invention. The DC-DC converter comprises an upper switching element or n-type MOS transistor Q1, and a lower switching element or n-type MOS transistor Q2 serially connected to the transistor Q1 at a node N1. The two transistors are connected between an input terminal N0 supplied with an input voltage Vin and a ground line GND supplied with a reference voltage (0).

The node N1 is connected to one end of an inductor L1 and the other end of the inductor L1 is employed as an output terminal N2 for providing an output voltage Vout. A smoothing capacitor C1 is connected between the output terminal N2 and the ground terminal to smooth the output voltage Vout.

The transistor Q1 can be switched between the non-conductive state and the conductive state by varying the level of a gate voltage P4 applied to the gate thereof. Similarly, the transistor Q2 can be switched between the non-conductive state and the conductive state by varying the level of a gate voltage P7 applied to the gate thereof. The levels of the gate voltages P4 and P7 can be controlled at a controller 100. The controller 100 controls the gate voltages P4 and P7 to alternately turn on the transistors Q1 and Q2.

Figure 2:
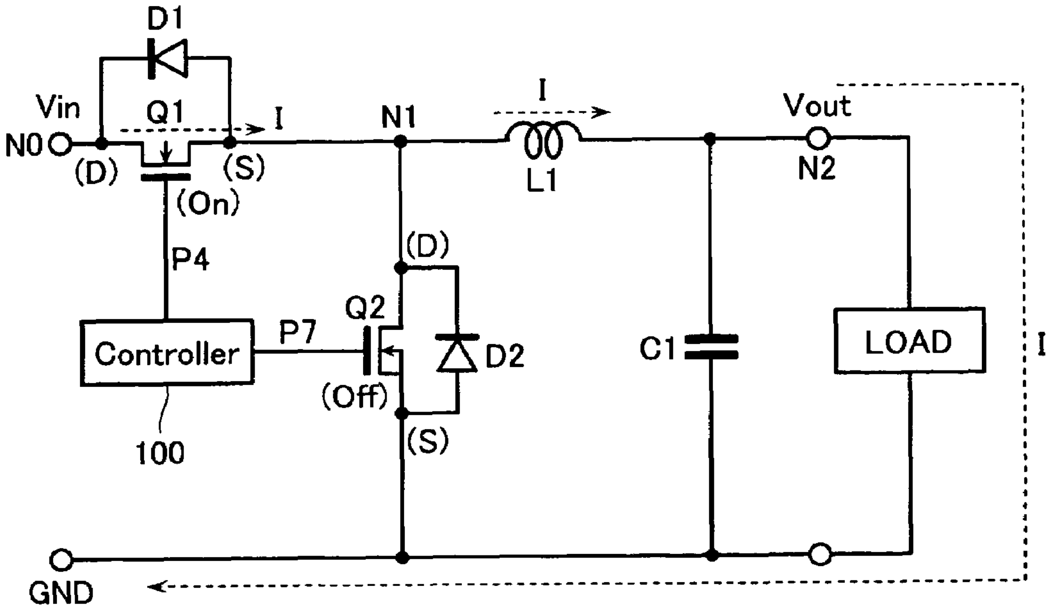
FIG. 2 illustrates an operation of the DC-DC converter shown in FIG. 1.
Figure 3:
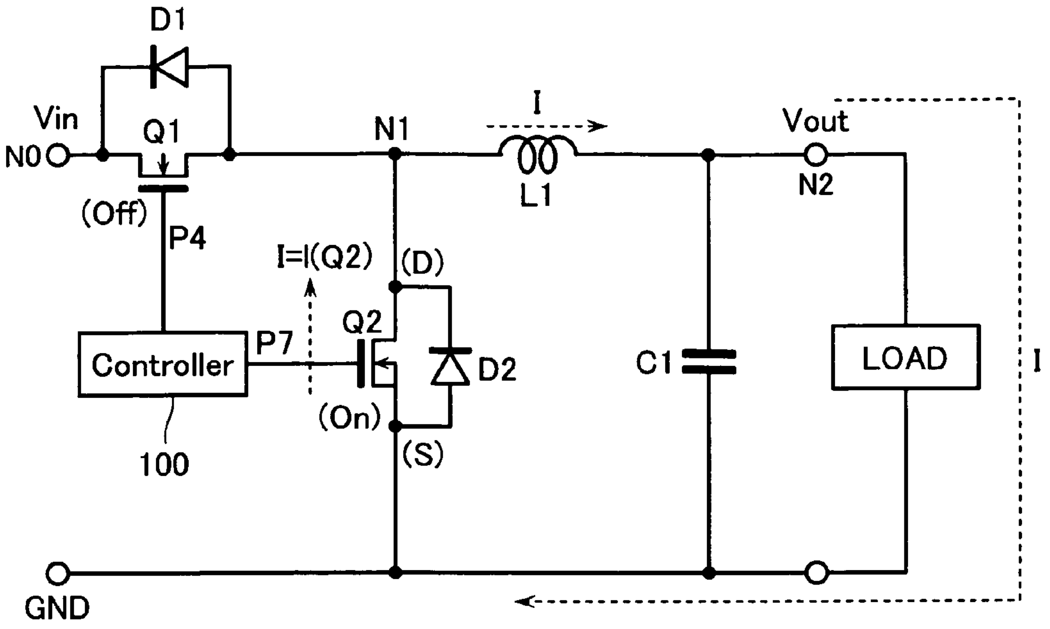
FIG. 3 illustrates an operation of the DC-DC converter shown in FIG. 1.

When the transistor Q1 is made conductive and the transistor Q2 is made non-conductive, a current I based on the input voltage Vin is supplied to a load through the transistor Q1 and the inductor L1 (FIG. 2). When the transistor Q1 is made non-conductive and the transistor Q2 is made conductive on the other hand, the current I based on energy accumulated in the inductor L1 causes a regenerative current I(Q2) to flow in the transistor Q2 through the load (FIG. 3). Thereafter, the states shown in FIGS. 2 and 3 are alternated to convert the input voltage Vin to the output voltage Vout of a different level, which is provided to the load.

Like under a normal bias condition, a source region (S) is shorted with a p-type substrate in the n-type MOS transistor Q2, and thus the transistor has a respective parasitic diode D2 with its forward direction from the p-type substrate to an n-type drain region (D). Conduction of the parasitic diode D2 lowers the switching speed and increases the power loss due to a recovery phenomenon. Therefore, the transistor Q2 is employed on condition that the drain-source voltage is prevented from exceeding the forward voltage of the diode D2.

Figure 21:
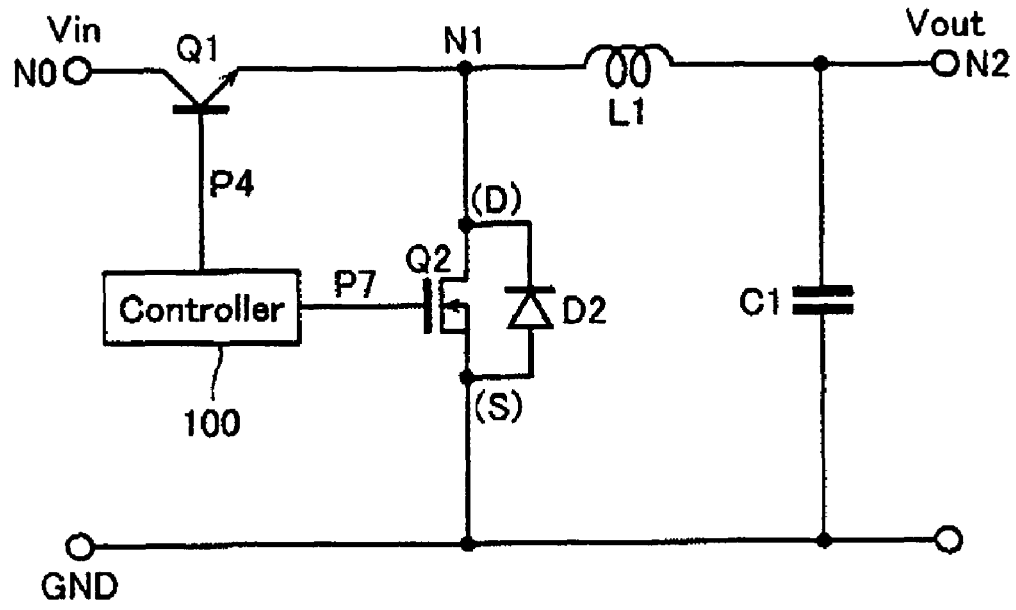
FIG. 21 illustrates an alternative embodiment of a DC-DC converter.

The upper switching element or transistor Q1 may comprise a p-type MOS transistor. This case has reverse relations in all such as the source-drain potential relation and the sign of the gate voltage. An element having a different structure from the lower switching element, such as a bipolar transistor, may also be employed, as shown in FIG. 21.

Figure 4:
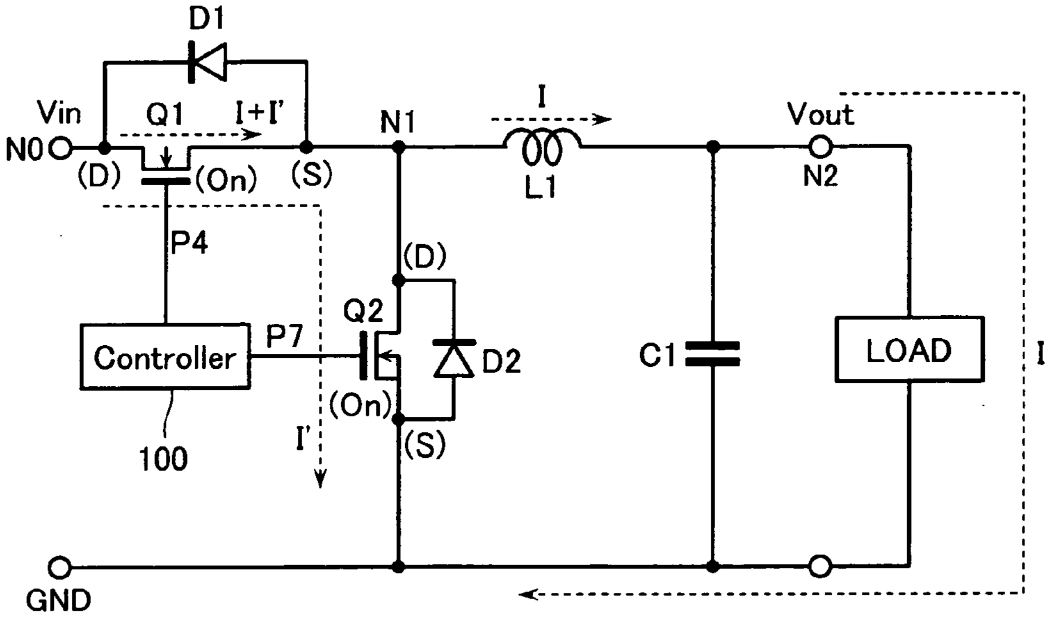
FIG. 4 illustrates an operation time chart of the DC-DC converter shown in FIG. 1.
Figure 5:
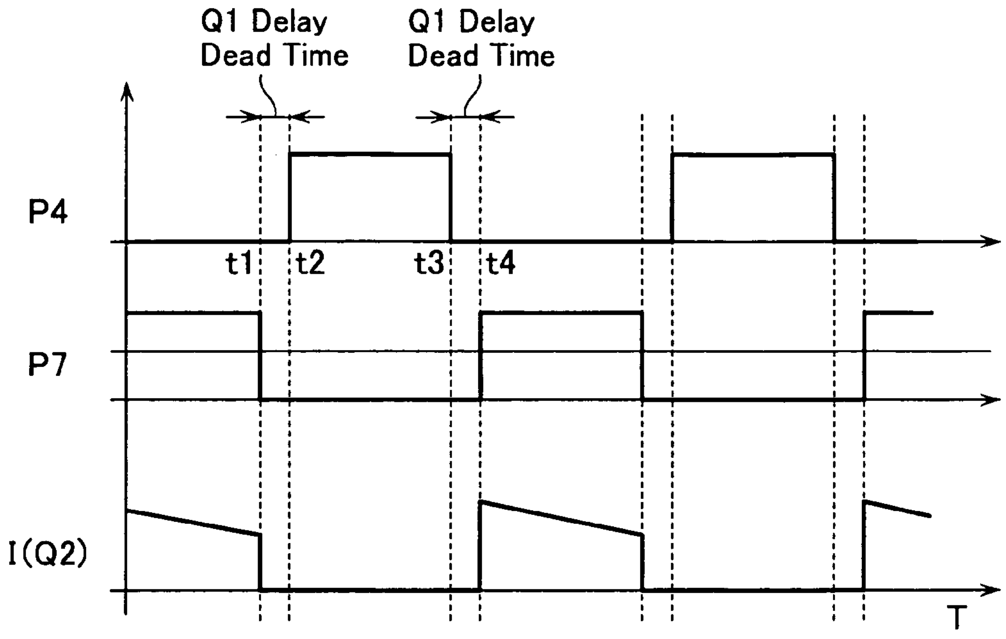
FIG. 5 PRIOR ART
FIG. 5 shows an operation of a controller 100 in a conventional DC-DC converter.

If the transistor Q1 and Q2 are turned on at the same time, a through current I' shown in FIG. 4 flows therethrough. This current increases the power loss and may induce a breakdown in the transistor Q1 and Q2 possibly. In order to prevent this possibility, a dead time having an appropriate length (t1-t2, t3-t4) is determined to make the gate voltages P4 and P7 exhibit "L" level at the same time in the art as shown in FIG. 5. As a result, the transistor Q1 and Q2 are prevented from turning on at the same time even if a sudden noise appears, for example.

Figure 6:
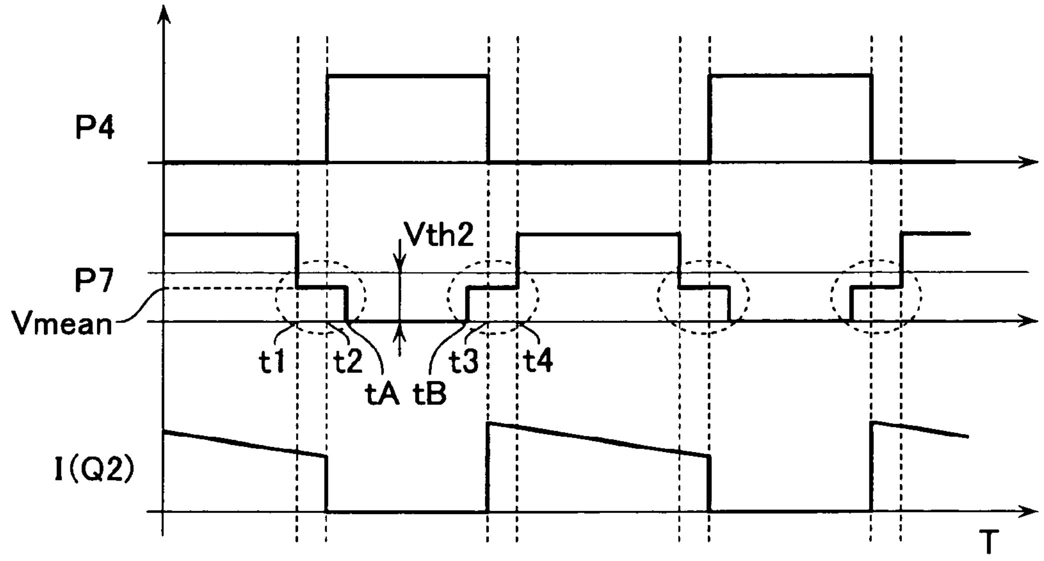
FIG. 6 shows an operation of a controller 100 in a DC-DC converter according to a first embodiment of the present invention.

On the other hand, the controller 100 of this embodiment switches the gate voltage P7 to a mean voltage Vmean as shown in FIG. 6 during a transition period (t1-tA, tB-t4). This period is present before and after the time (t2, t3) of logical transition of the gate voltage P4 between "L" level and "H" level. The mean voltage Vmean is higher than the reference voltage or "L" level and lower than a threshold voltage Vth2 of the transistor Q2. Preferably, it is lower than the threshold voltage Vth2 by a margin determined in consideration of factors such as perturbations. Thus, the transistor Q2 can switch between the conductive state and the non-conductive state immediately after the logical transition of the gate voltage P4. This is effective to reduce the power loss by the extent corresponding to the dead time over the prior art. The principle is based on the property of the MOS transistor and is described in detail below with reference to FIGS. 7-10.

Figure 7:
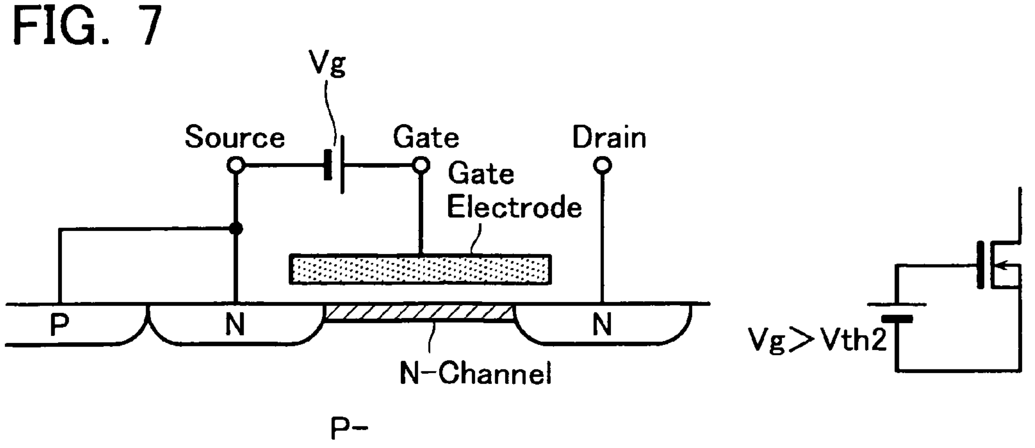
FIG. 7 shows the principle of MOSFET(non Vds vias mode)

As shown in FIG. 7, application of a gate voltage Vg higher than the threshold voltage Vth2 to a gate electrode forms an N-channel layer in a surface of a P-layer immediately beneath the gate electrode, which makes source-drain conduction. The N-channel layer is formed under a condition that a source-gate voltage Vgs is equal to or higher than the threshold voltage Vth2. In this example, the transistor Q2 is grounded at the source. Therefore, the n-channel is formed under a condition that the gate voltage Vg is equal to or higher than the threshold voltage Vth2. If the gate voltage Vg is lower than the threshold voltage Vth2, for example, equal to zero, the N-channel layer can not be formed and, even if a voltage is applied across source-drain, no current flows therethrough.

Figure 8:
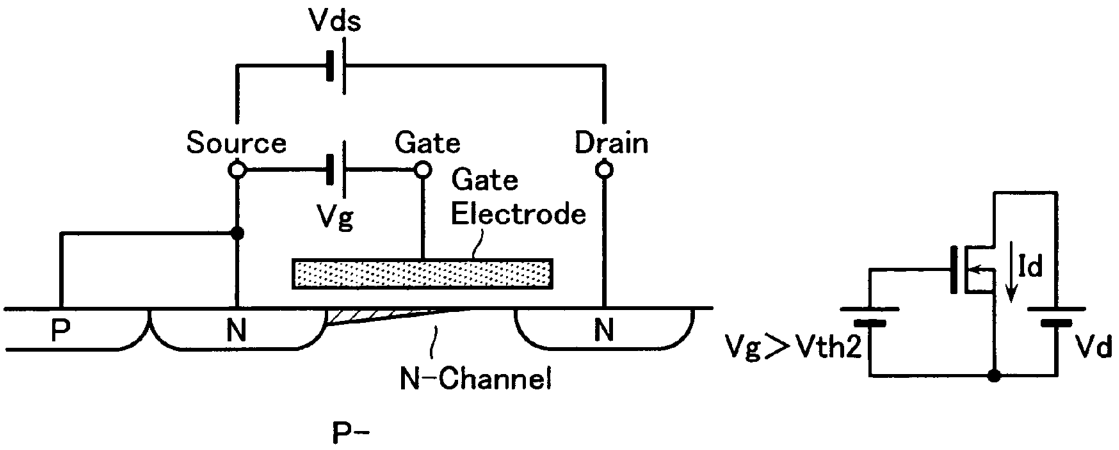
FIG. 8 shows the principle of MOSFET(normal Vds applied)
Figure 9:
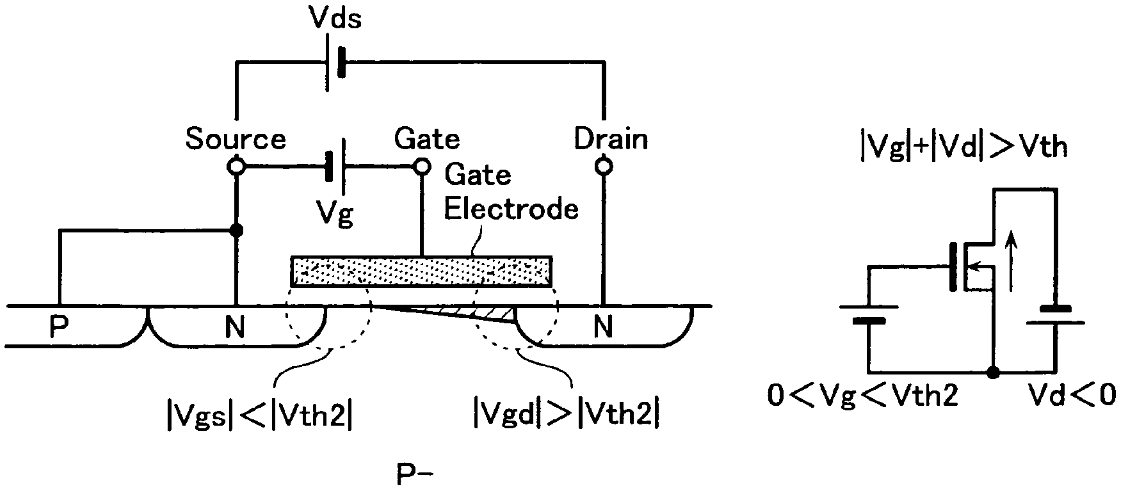
FIG. 9 shows the principle of MOSFET(reverse Vds applied)

Once the N-channel layer is formed, a current Id can flow through source-drain when a voltage Vds is applied across source-drain. In an n-type MOS transistor a drain potential Vd is generally controlled higher than a source potential Vs to allow current to flow through source-drain (hereinafter this state is referred to as "forward bias"). As the source-drain voltage Vds increases, the source-drain current Id also increases almost proportionally (unsaturated region). When the voltage Vds exceeds Vg, the n-channel layer pinches off as shown in FIG. 8, and the current Id hardly increases even if the voltage Vds elevates (saturated region).

Even if the drain potential Vd is controlled lower than the source potential Vs (hereinafter this state is referred to as “reverse bias”) in contrast to the above, current is allowed to flow. The transistor Q2 in FIG. 1 allows the regeneration current I(Q2) to flow therethrough under such the condition. In the case of reverse bias, however, the n-channel layer is formed immediately beneath the gate electrode of the n-type MOS transistor under such a condition that is determined not by the source-gate voltage Vgs but by the drain-gate voltage Vgd (=|Vg|+|Vd|).

Figure 10:
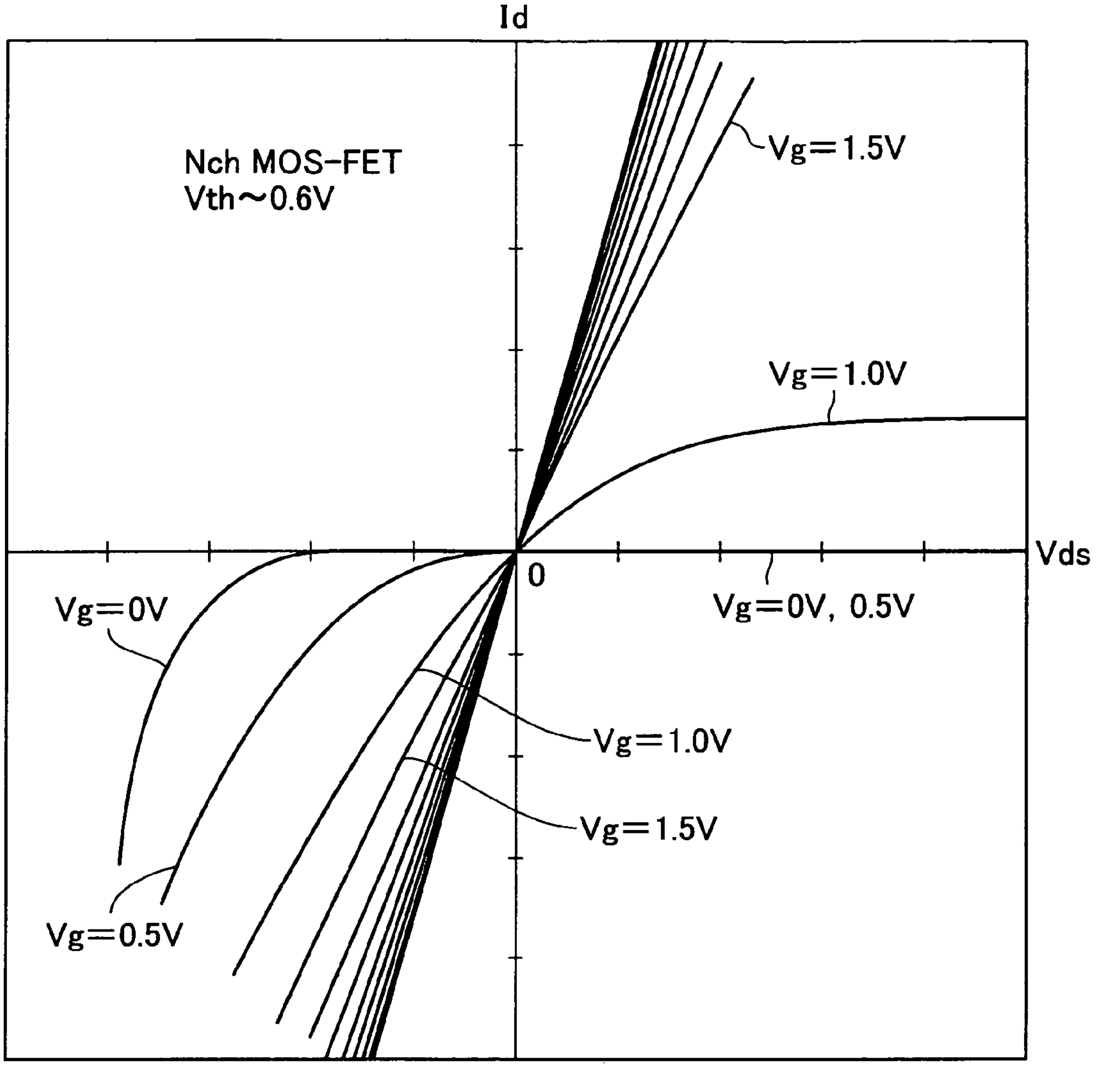
FIG. 10 is a set of graphs showing relations between a drain-source voltage Vds and a drain current Id in an n-type MOS transistor such as a transistor Q2.

There is a difference in condition for formation of the n-channel layer between the time of forward bias and the time of reverse bias. Therefore, the drain-source voltage Vds has relations with the drain current Id as shown in graphs of FIG. 10. Namely, if the gate voltage Vg is equal to or higher than a threshold voltage (of 0.6 V in this example), the drain current Id can flow regardless of whether the drain-source voltage Vds is positive or negative. FIG. 10 shows graphs in the cases of the gate voltages Vg of 1.0 V, 1.5 V and more than 1.5 V.

If the gate voltage Vg is equal to 0 V, and the drain-source voltage Vds is positive or the drain has a higher potential than the source (forward bias), the drain current Id can not flow.

On the other hand, if the drain-source voltage Vds is negative or the drain has a lower potential than the source (reverse bias), the drain current Id starts to flow when Vds elevates above the forward voltage of the parasitic diode.

If the gate voltage Vg is higher than 0 V and lower than the threshold voltage, for example, equal to a mean voltage of about 0.5 V, the drain current Id can not flow in the state of forward bias like in the case of Vg=0 V. To the contrary, in the state of reverse bias the drain current starts to flow when the drain-source voltage Vds closes to −0.1 V as shown in FIG. 10. The present invention focuses attention on this characteristic and applies a gate voltage Vg (of about 0.5 V, the mean voltage Vmean) as a mean voltage lower than such the threshold voltage in a transition period. This period is present before and after the time of logical transition between “L” level and “H” level of the gate voltage P4 of the transistor Q1 in FIG. 1. Thus, the transistor Q2 can switch between the conductive state and the non-conductive state immediately after the logical transition of the gate voltage P4. Accordingly, it is possible to reduce the power loss by the extent corresponding to the dead time over the prior art.

Figure 11:
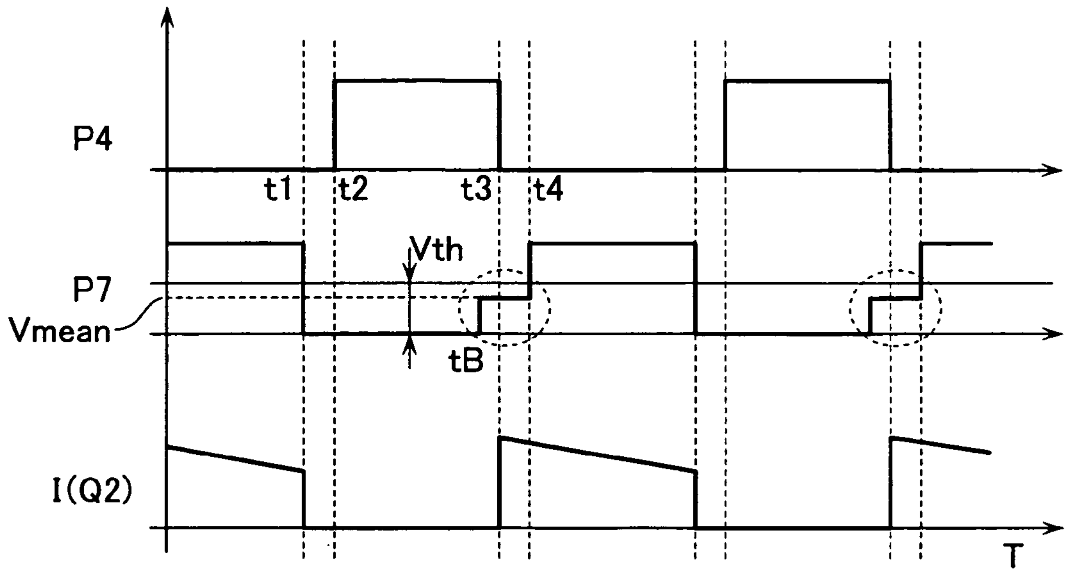
FIG. 11 shows an operation of a controller 100 in a DC-DC converter according to a second embodiment of the present invention.

A second embodiment of the present invention is described next based on FIG. 11. As shown in FIG. 11, the gate voltage P7 is switched from the reference voltage to the mean voltage Vmean during a transition period (tB-t4) present before and after the time (t3) of transition of the gate voltage P4 from “H” level to “L” level, like the first embodiment. Different from the first embodiment, however, the gate voltage P7 is switched not to the mean voltage Vmean but to the reference voltage during a transition period present before and after the time (t2) of transition of the gate voltage P4 from “L” level to “H” level. This configuration may increase the power loss compared to the first embodiment by the extent corresponding to substantially extended dead times though it can reduce the possibility of the through current flowing through the transistors Q1 and Q2 when they are turned on at the same time.

At the time of transition of the gate voltage P4 from “L” level to “H” level, the transistor Q1 turns on and the transistor Q2 turns off to elevate the potential on the drain (node N1) of the transistor Q2. As the transistor Q2 has a drain-gate capacitance, a charging current flows in the capacitance when the potential on the node N1 elevates. In this case, if an element in the controller 100 connected to the gate of the transistor Q2 has a large on-resistance, the gate potential of the transistor Q2 elevates above the threshold voltage Vth2 when the charging current flows. As a result, the transistor Q2 turns on (makes an erroneous ON) and allows a through current to flow therethrough. In this case, elevation of the gate potential Q2 up to Vmean like in the first embodiment increases the possibility of the erroneous ON. Therefore, the second embodiment is suitable for lowering the possibility of the erroneous ON.

Figure 12A:
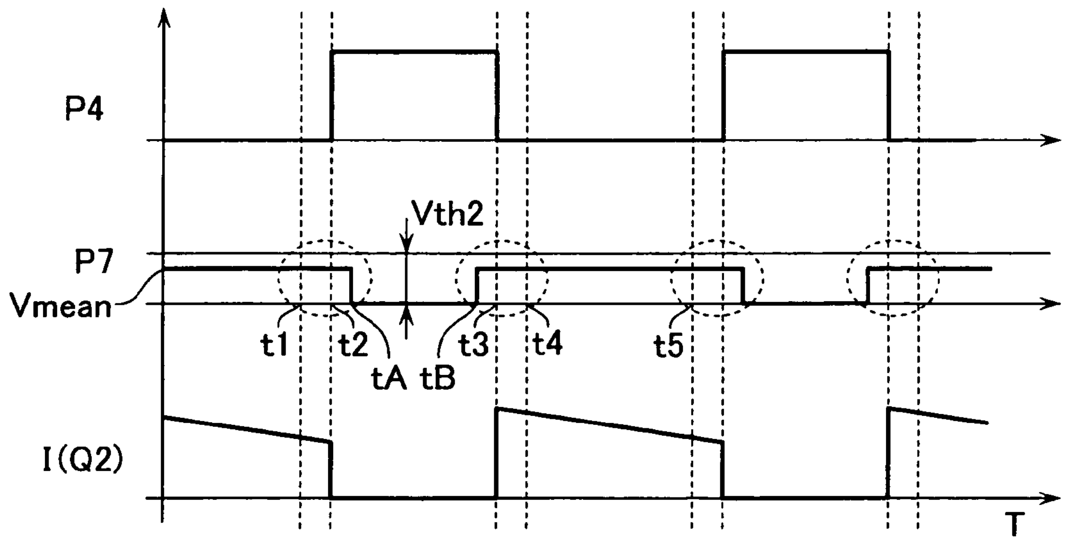
FIG. 12A shows an operation of a controller 100 in a DC-DC converter according to a third embodiment of the present invention.

A third embodiment of the present invention is described next with reference to FIG. 12A. In this embodiment, the gate voltage P4 transits from “H” to “L” level to turnoff the transistor Q1 (time t3). Even after the above-described transition period (tB-t4) elapses, the gate voltage P7 is not elevated to “H” level but still kept at the mean voltage Vmean. This is different from the first embodiment. Also in this embodiment, the transistor Q2 can be kept conductive while the transistor Q1 is non-conductive. In addition, the transistor Q2 can be turned on immediately after the transition of the transistor Q1 to the non-conductive state (see FIG. 10), like in the first embodiment.

Figure 12B:
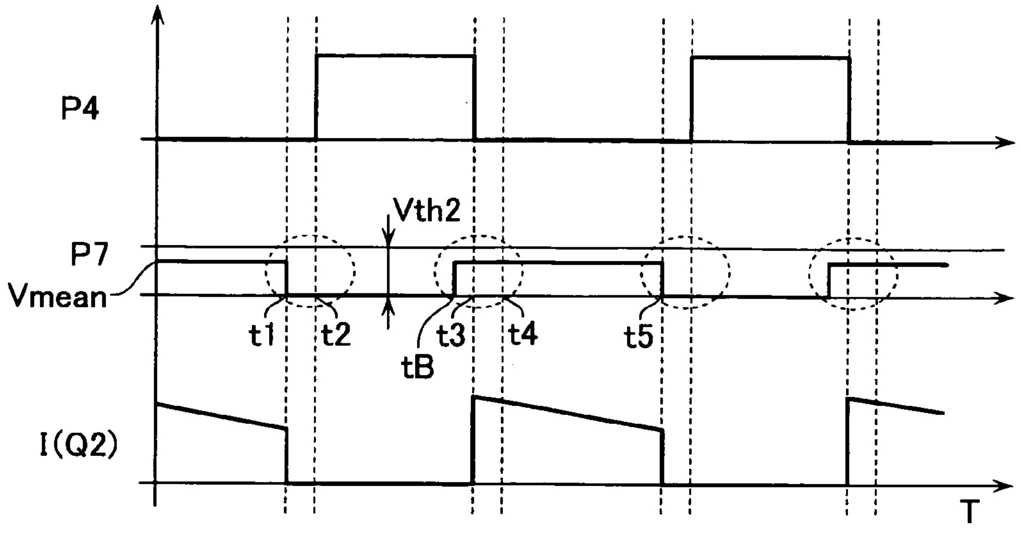
FIG. 12B shows an operation of a controller 100 in a DC-DC converter according to a fourth embodiment of the present invention.

A fourth embodiment of the present invention is described next with reference to FIG. 12B. In this embodiment, while the gate voltage P4 is kept at “L” level to turn off the transistor Q1, the gate voltage P7 is not elevated to the input voltage Vin but kept at the mean voltage Vmean. This is similar to the third embodiment. Before the gate voltage P4 rises from “L” to “H” level (time t2, for example) to turn on the transistor Q1, the gate voltage P7 falls from “H” to “L”. This is different from the third embodiment. This configuration can lower the possibility of the erroneous ON, like the second embodiment.

Figure 12C:
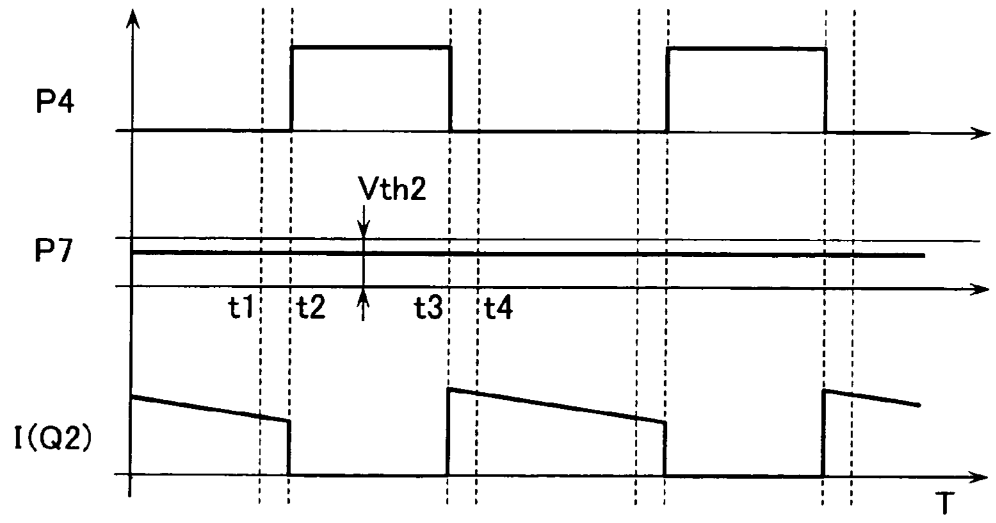
FIG. 12C shows an operation of a controller 100 in a DC-DC converter according to a fifth embodiment of the present invention.

A fifth embodiment of the present invention is described next with reference to FIG. 12C. In this embodiment, the gate voltage P7 is always kept at the mean voltage Vmean. This is different from the previous embodiments. Also in this embodiment, the transistor Q2 can be kept conductive while the transistor Q1 is non-conductive. While the transistor Q1 is conductive, the transistor Q2 can be made non-conductive. When the transistor Q1 is conductive, the drain potential is higher than the source potential (forward bias) and accordingly the transistor Q2 can not turn on if the gate voltage Vg is lower than the threshold voltage Vth2 (see the graph of Vg=0.5 in FIG. 10). In addition, the transistor Q2 can be turned on immediately after the transition of the transistor Q1 to the non-conductive state (see FIG. 10), like the first embodiment.

Figure 12D:
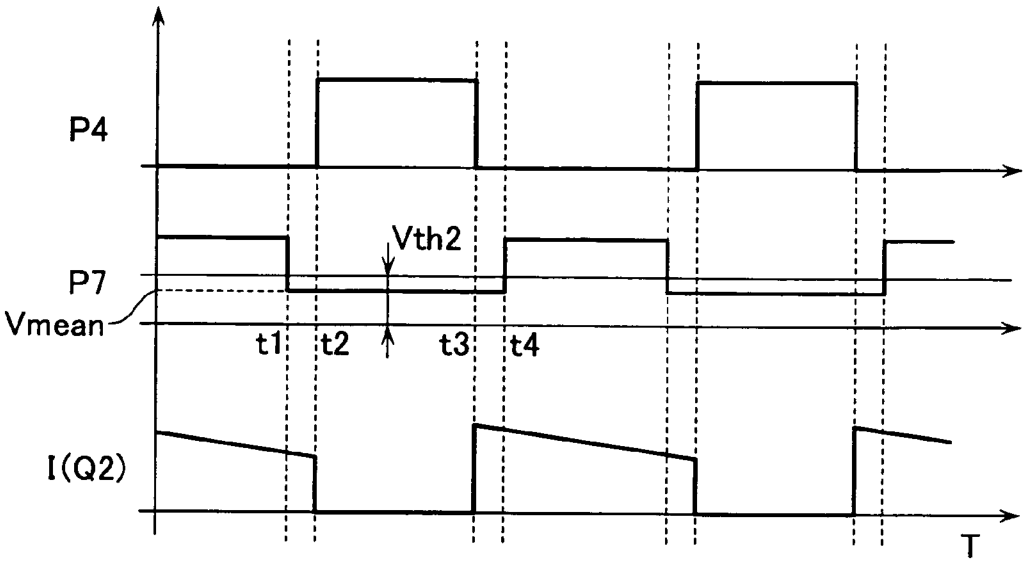
FIG. 12D shows an operation of a controller 100 in a DC-DC converter according to a sixth embodiment of the present invention.

A sixth embodiment of the present invention is described next with reference to FIG. 12D. In this embodiment, while the gate voltage P4 is kept at “H” level to turn on the transistor Q1, the gate voltage P7 is not lowered to the reference voltage but kept at the mean voltage Vmean. This is different from the previous embodiments. While the transistor Q1 is conductive, the transistor Q2 is forward-biased. Therefore, the transistor Q2 stays non-conductive even if the mean voltage Vmean is applied to the gate. Such the configuration is also possible. This configuration can simplify the control of the gate voltage P7 and configure the controller 100 simply.

Figure 13:
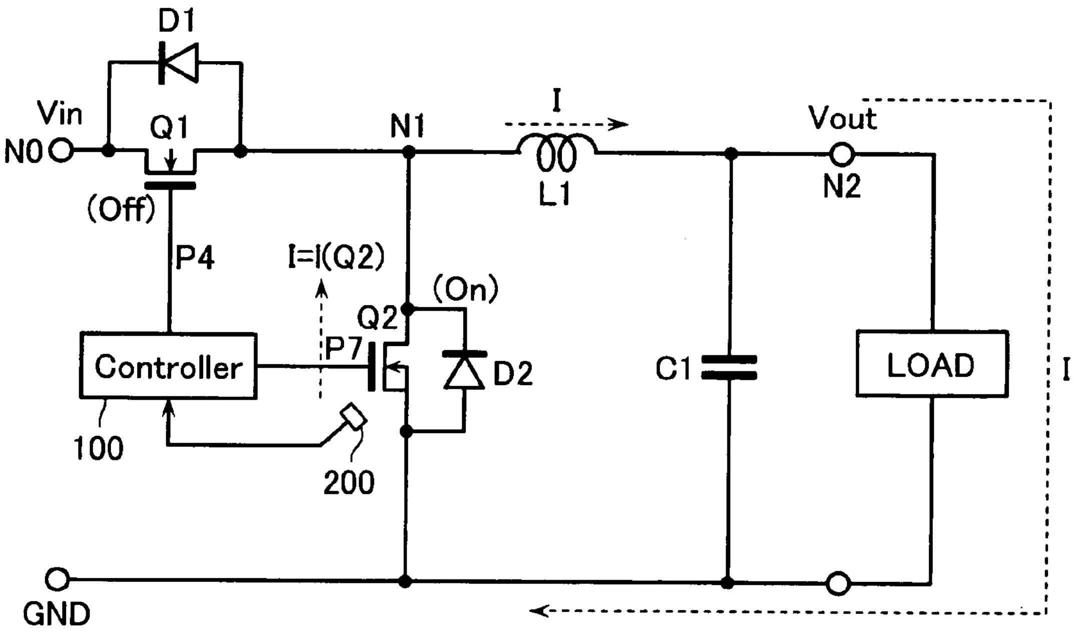
FIG. 13 is a circuit diagram showing a basic configuration of a DC-DC converter according to a seventh embodiment of the present invention.

A seventh embodiment of the present invention is described next with reference to FIG. 13. This embodiment is provided with a temperature sensor 200 to sense a temperature at the transistor Q2. The sensed result is fed back to the controller 100 and employed to control the level of the gate voltage P7. This is different from the previous embodiments.

The threshold voltage Vth2 of the transistor Q2 may often be temperature-dependent. In order to reduce the power loss, it is preferable to approximate the level of the mean voltage Vmean to Vth2 as close as possible. When a variation in temperature lowers Vth2, the transistor Q2 may turn on erroneously and allow a through current to flow possibly if the gate voltage P7 remains unchanged. For prevention of this error, when the temperature sensor 200 senses a temperature elevation, the mean voltage Vmean is controlled to exhibit a lower value than before the temperature elevation. This is effective to prevent the erroneous ON of the transistor Q2 and minimize the power loss at the same time.

A specified configuration example and operation of the controller 100 is described with reference to FIGS. 14-21. Different from FIG. 1 and so forth, in FIGS. 14, 16, 18 and 20 the transistor Q1 is described as a p-type MOS transistor. Accordingly, the transistor Q1 turns on when the gate voltage P4 is at "L" level and turns off when the gate voltage P4 is at "H" level.

Figure 14:
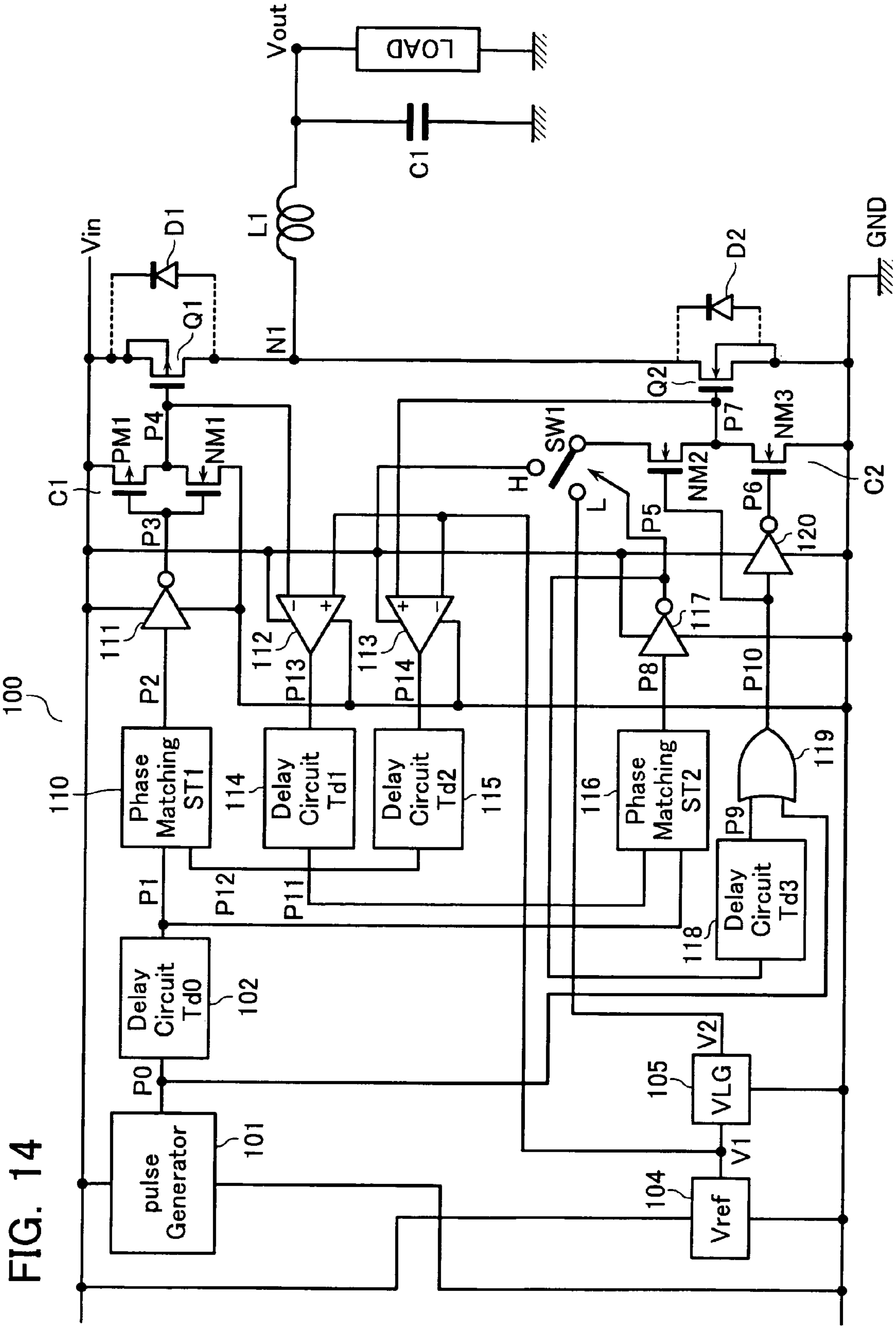
FIG. 14 shows a specified configuration example of the controller 100 for operation of the first embodiment.

FIG. 14 shows a configuration example of the controller 100 for use in operation of the first embodiment.

The controller 100 comprises a CMOS inverter C1 operative to provide an output signal or the gate voltage P4 to the gate of the transistor Q1. The controller 100 also comprises a switching circuit C2 operative to switch the level of the gate voltage P7 supplied to the gate of the transistor Q2. The CMOS inverter C1 includes a p-type MOS transistor PM1 and an n-type MOS transistor NM1, which are connected together at a common drain serving as an output terminal. A signal P3 is commonly supplied to the gates of both transistors.

The switching circuit C2 includes an n-type MOS transistor NM2, an n-type MOS transistor NM3 and a switching element SW1. The source of the transistor NM2 and the drain of the transistor NM3 are connected to an output terminal for the gate voltage P7. The signals P10 and P6 are supplied to the gates of the transistors NM2 and NM3, respectively. The switching element SW1 is operative to connect either a terminal H supplied with the input voltage Vin or a terminal L supplied with a voltage V2 corresponding to the mean voltage Vmean selectively to the drain of the transistor NM2. In this case, the drain of the transistor NM2 is connected to the terminal H when a signal P5 is at H level, and the drain of the transistor NM2 is connected to the terminal L when the signal P5 is at L level. The voltage V2 applied to the terminal L is generated from a bias circuit 105 based on a reference voltage V1.

The signal P10 is such a signal that becomes "H" level only during a "H" level period of the signal P4 and certain periods (transition periods) present before and after it. On the other hand, a signal P6 is an inverted signal of the signal P10 by an inverter 120. Accordingly, the transistors NM2 and NM3 alternately turn on and the gate voltage P7 switches between the reference voltage and the voltage (Vin or V2) applied to the drain of the transistor NM3. Vin and V2 are switched by the switching element SW1 based on the signal P5. The signal P5 is such a signal that becomes "H" level during the "H" level period of the signal P4 except for the above-described transition periods.

Figure 15:
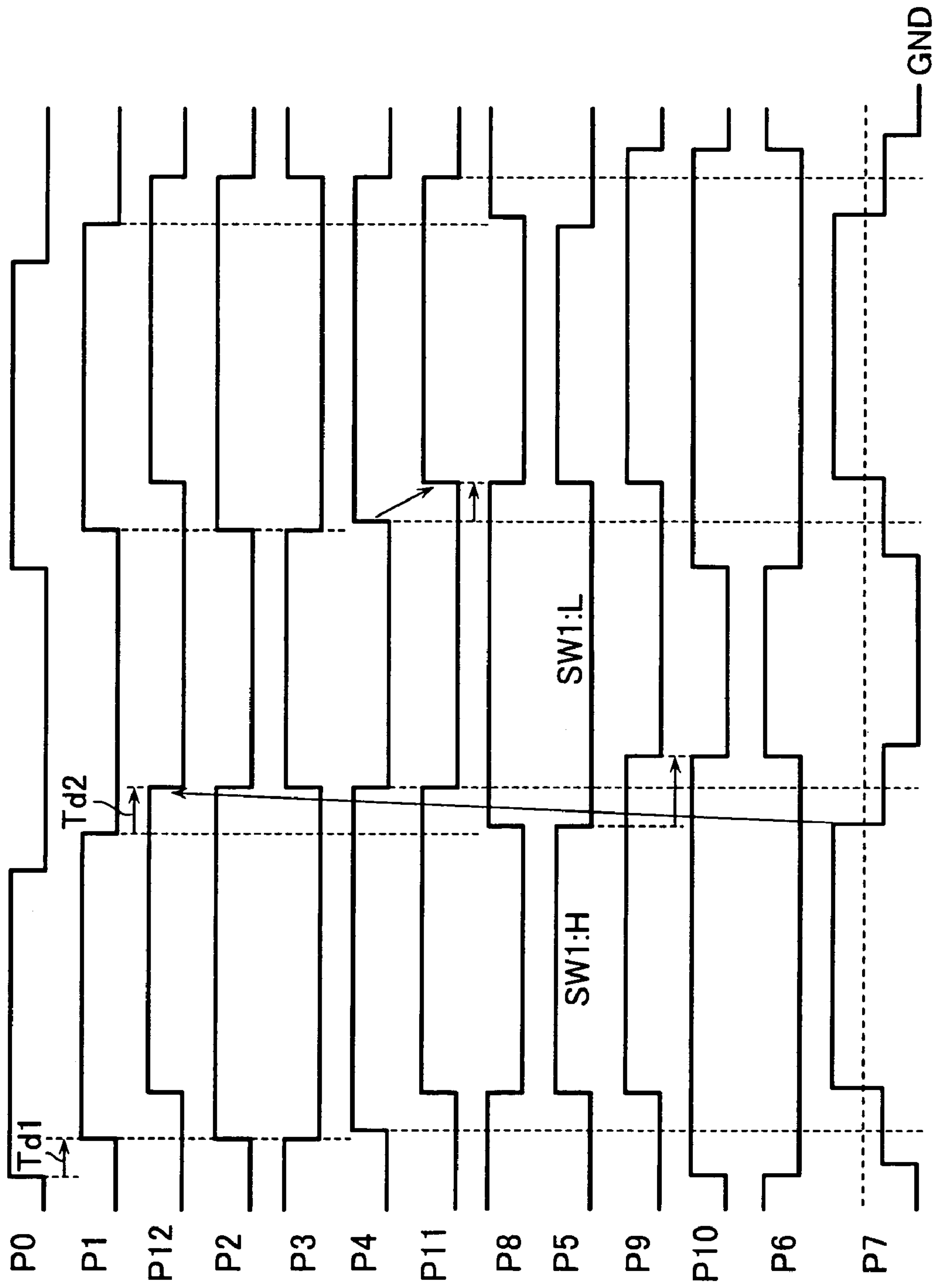
FIG. 15 is a timing chart showing the operation of the controller 100 shown in FIG. 14.

When the signal P10 transits from "L" level to "H" level and the signal P6 transits from "H" level to "L" level at the same time, the gate voltage P7 rises from "L" level to the voltage V2. Thereafter, when the signal P5 rises from "L" level to "H" level after the above-described transition period elapses, the switching element SW1 switches from the terminal L to the terminal H. As a result, the gate voltage P7 rises from the voltage V2 to Vin. When the signal P5 falls from "H" level to "L" level in the next transition period, the gate voltage P7 falls from the voltage Vin to V2. When the signal P10 transits from "H" level to "L" level after the transition period elapses and the signal P6 transits from "L" level to "H" level at the same time, the gate voltage P7 falls to "L" level. In this way, the gate voltage P7 as shown in FIG. 15 is generated.

For generation of these signals P4, P5, P6 and P7 with the above-described timings, the controller 100 comprises a pulse generator 101, delay circuits 102, 114, 115 and 116, phase matching circuits 110 and 116, comparators 112 and 113, inverters 111, 117 and 120 and an OR circuit 119.

The pulse controller 101 is a circuit that generates certain pulse signals P0 at a certain interval. The delay circuit 102 gives a time delay of Td0 to the pulse signal P0 to provide a delayed signal P1. The signal P1 is fed to the phase matching circuit 110. The phase matching circuit 110 derives a logical sum between the signal P1 and a delayed signal P12 from the delay circuit 115 and provides the logical sum or a signal P2. An inverted signal P3 of the signal P2 by the inverter 111 is further inverted through the COMS inverter C1 to generate the gate voltage P4. The delay circuit 115 gives a time delay of Td2 to a compared output P14 resulted from comparison of the gate voltage P7 with the reference voltage V1 output from a reference voltage generator 104 to provide a delayed signal P12.

The comparator 112 compares the gate voltage P4 with the reference voltage V1 output from the reference voltage generator 104 to provide a compared signal P13. The delay circuit 114 gives a certain time delay to the compared signal P13 to provide a delayed signal P11. This signal P11 is fed to the phase matching circuit 116 together with the signal P1. The phase matching circuit 116 provides a signal P8 that falls in synchronous with the rise of the signal P11 and rises in synchronous with the fall of the signal P1. This signal P8 is inverted through the inverter 117 to generate the signal P5 having a certain timing relation with the signal P4.

The signal P5 is also fed to the delay circuit 118 to give a certain time delay to the signal P5 to generate a delayed signal P9. The logical sum signal P10 between the signals P9 and P1 is generated at the OR circuit 119. An inverted signal of the signal P10 by the inverter 120 corresponds to the above-described signal P6.

In the configuration example of FIG. 14, the signal P12 generated by monitoring the logical transition of the gate voltage P7 on the transistor Q2 is fed to the phase matching circuit 110 to adjust the transition timing of the gate voltage P4 on the transistor Q1. In addition, the signal P11 generated by monitoring the logical transition of the gate voltage P4 on the transistor Q1 is fed to the phase matching circuit 116 to adjust the transition timing of the gate voltage P7 on the transistor Q2. This is effective to appropriately correct the transition timing of the gate voltage P7 that has variable voltage values in three stages, and the transition timing of the gate voltage P4.

A configuration example and operation of the controller 100 available in operation of the second embodiment of the present invention (FIG. 11) is described with reference to FIGS. 16 and 17. The CMOS converter C1, the switching circuit C2, the pulse generator 101, the reference voltage generator 104 and the bias circuit 105 are similarly configured as in FIG. 14. In the configuration example of FIG. 16, however, the comparators and the phase matching circuits are omitted. Instead, delay circuits 102' and 123 are cascaded and output signals P1 and P2' therefrom are fed to AND circuits 126 and 127 and an OR circuit 128 to generate signals P5, P6 and P3.

A signal P19 is generated to produce a waveform similar to P7 as shown in FIG. 11. The signal P19 is employed to switch the switching element SW1. The signal P19 transits from "L" to "H" at the same time when the signal P10 transits from "H" to "L", and it transits from "H" to "L" when the above-described transition period elapses after the signal P10 transits from "L" to "H". The switching element SW1 connects the drain of the transistor NM2 to the terminal H (voltage Vin) when the signal P19 is at "H" level, and it connects the drain of the transistor NM3 to the terminal L (voltage V2) when the signal P19 is at "L" level.

Figure 16:
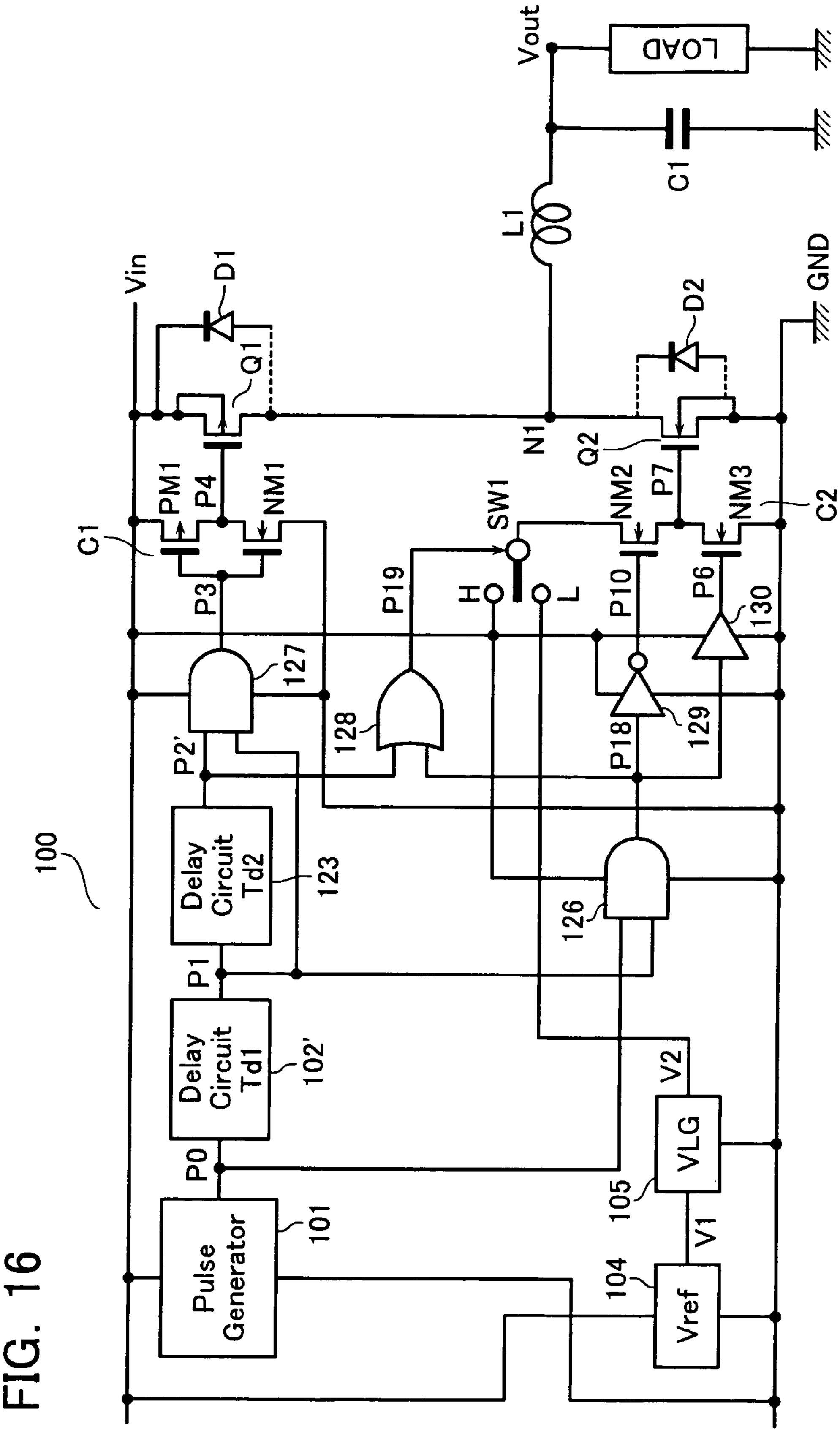
FIG. 16 shows a specified configuration example of the controller 100 for operation of the second embodiment.
Figure 17:
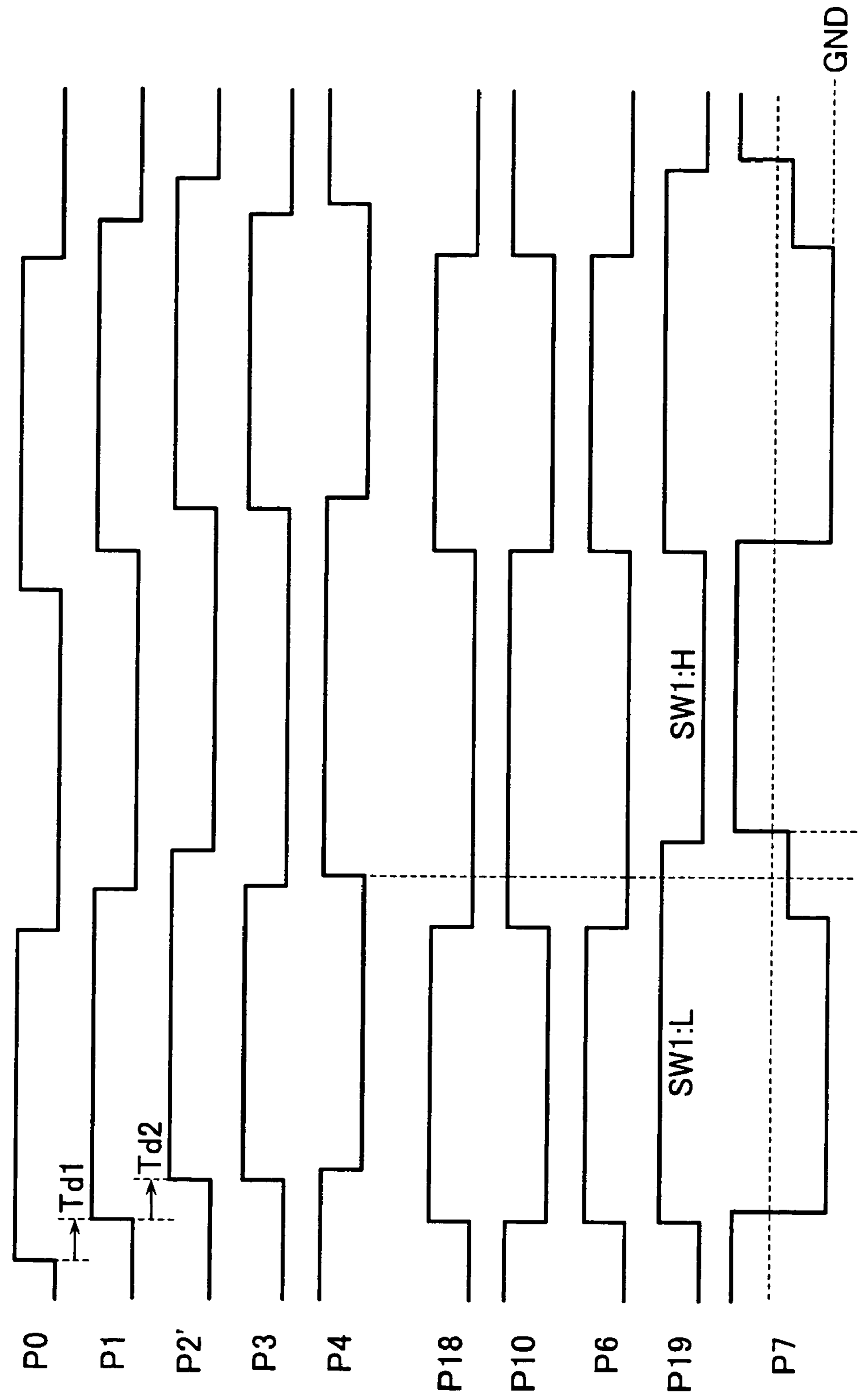
FIG. 17 is a timing chart showing the operation of the controller 100 shown in FIG. 16.

A circuit available in generation of the signals P3, P4, P5, P6 and P19 may comprise the delay circuits 102' and 123, the AND circuits 126 and 127 and the OR circuit 128 in the configuration example of FIG. 16.

The AND circuit 126 provides a logical product signal P18 between the signal P0 generated from the pulse generator 101 and the signal P1 derived from the signal P0 and given a time delay of Td1 at the delay circuit 102'. The signal P18 is inverted at the inverter 129 and fed to the gate of the transistor NM2 as the signal P10. The signal P18 is also fed through a buffer 130 to the gate of the transistor NM3 as the signal P6.

The AND circuit 127 provides a logical product signal P3 between the signal P1 and the signal P2' derived from the signal P1 and given a time delay of Td2 at the delay circuit 123. Inversion of the signal P3 at the COMS inverter C1 yields the signal P4. The signal P4 falls with a time delay of almost Td1+Td2 after the pulse signal P0 rises. The signal P4 rises behind the pulse signal P10 with a time delay of Td2. This is effective to secure the dead time when the transistor Q1 switches from the non-conductive state to the conductive state and the transistor Q2 switches from the conductive state to the non-conductive state in contrast.

The signal P19 is provided from the OR circuit 128 as a logical sum signal between the signals P2' and P18. The signal P19 therefore rises behind the signal P4 with a time delay of Td2 and falls behind the signal P6 with a time delay of Td1+Td2. As a result, the gate voltage P7 has such a waveform that supplies the voltage V2 to the gate of the transistor Q2 during a period present before and after the time of transition between the conductive state and the non-conductive state of the transistor Q1.

Figure 18:
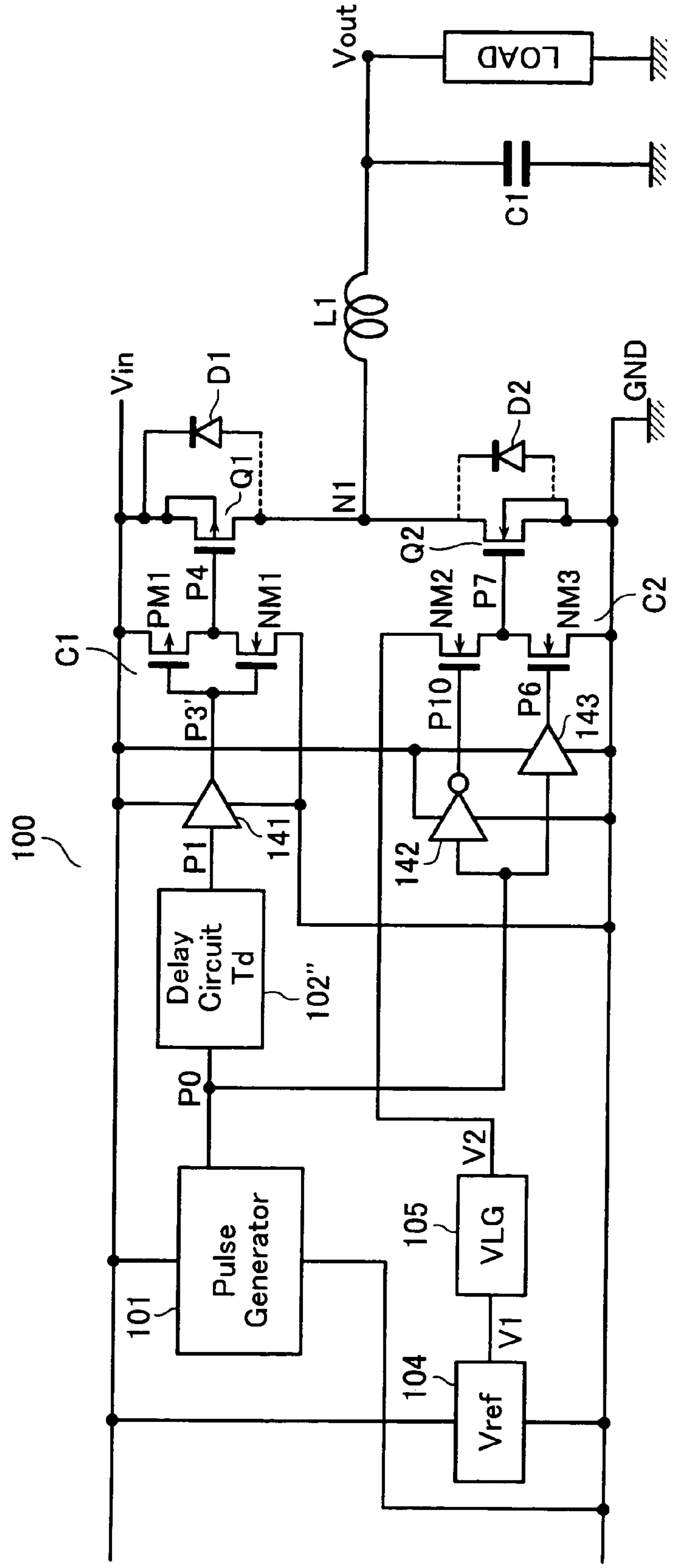
FIG. 18 shows a specified configuration example of the controller 100 for operation of the fourth embodiment.
Figure 19:
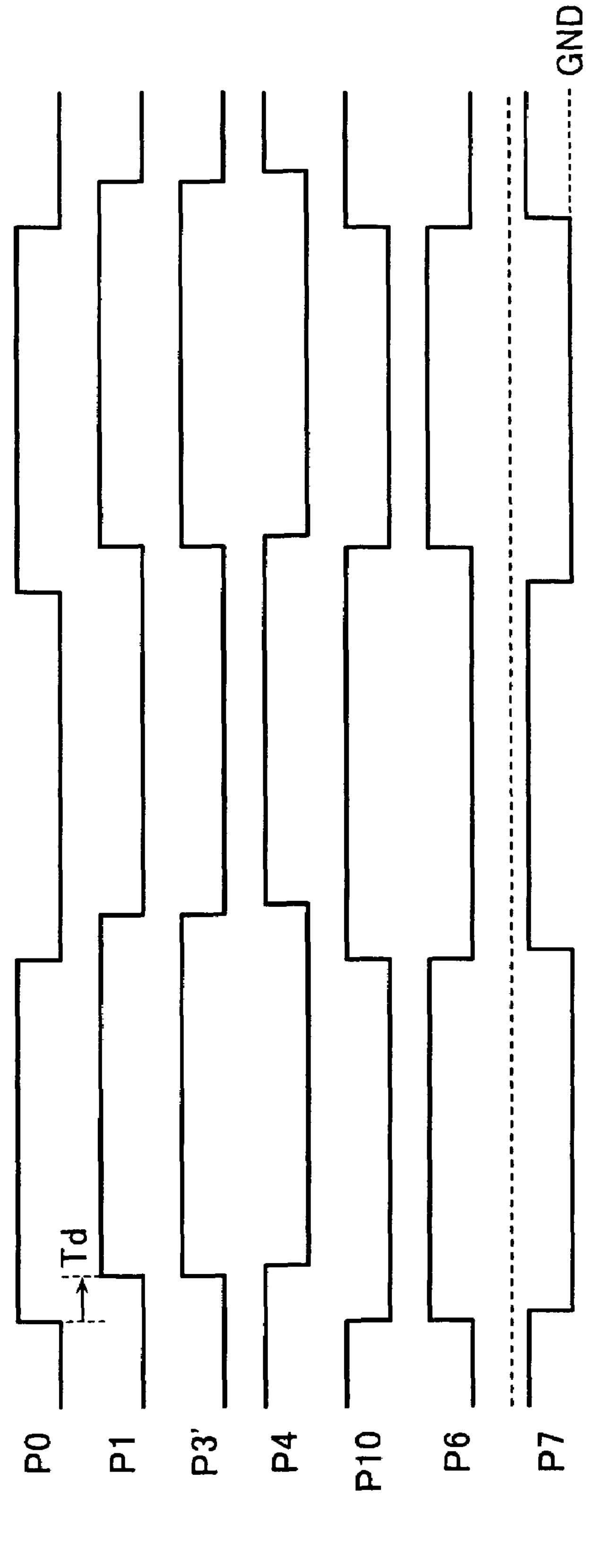
FIG. 19 is a timing chart showing the operation of the controller 100 shown in FIG. 18.

A configuration example and operation of the controller 100 available in operation of the fourth embodiment of the present invention (FIG. 12B) is described with reference to FIGS. 18 and 19. In the fourth embodiment, the gate voltage P7 is restricted to fluctuate between the voltage V2 and the reference voltage. Accordingly, the controller 100 can be structured simpler than those in FIGS. 14 and 16. The switching circuit C2 is not provided with the switching element SW1 and the voltage V2 is steadily applied to the drain of the transistor NM2. A signal P3' input to the CMOS inverter C1 is such a signal that is originated from the signal P0 and given a time delay of Td at a delay circuit 102". Signals P10 and P6 input to the CMOS inverter C1 are such signals that are switched together with the signal P0 at the same timing. Therefore, the gate voltage P7 becomes a signal almost synchronous with the signal P0 because it exhibits the voltage V2 when the signal P10 is at "H" and the reference voltage when the signal P10 is at "L". Thus, the resultant signals P4 and P7 have such waveforms as shown in FIG. 19. For configuration of the controller 100 available in operation of the third embodiment (FIG. 12A), an OR circuit may be provided in FIG. 18 to derive a logical sum signal from the signals P0 and P1. This logical sum signal and an inverted signal thereof can be employed as the signals P10 and P6.

Figure 20:
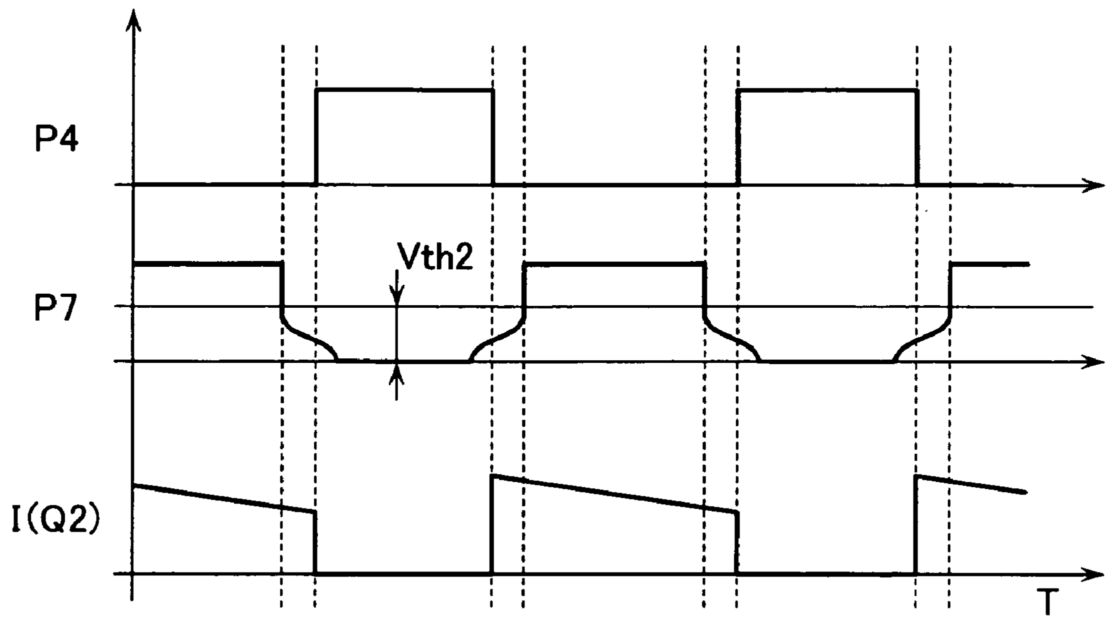
FIG. 20 shows an alternative embodiment of the present invention.

The invention has been described on the embodiments though the present invention is not limited to these embodiments but rather can be given various additions, modifications and substitutions without departing the scope and spirit of the invention. For example, in the above embodiments, the gate voltage P7 is switched stepwise to the mean voltage Vmean during the transition period present before and after the time of logical transition of the gate voltage P4. In contrast, as shown in FIG. 20, the gate voltage P7 may also be controlled to rise from the reference voltage to the mean voltage Vmean gradually at a certain gradient or fall from the mean voltage Vmean to the reference voltage gradually at a certain gradient.

What is claimed is:

1. A semiconductor device, comprising:

an upper semiconductor switching element having a first control terminal to receive a first control voltage applied thereto and operative to switch between a conductive state and a non-conductive state when said first control voltage varies from "H" level to "L" level or from "L" level to "H" level;

a lower semiconductor switching element serially connected to said upper semiconductor switching element at a node, and having a second control terminal to receive a second control voltage applied thereto and operative to switch between the conductive state and the non-conductive state when said second control voltage varies; and a controller operative to control levels of said first control voltage and said second control voltage to alternately turn on said upper semiconductor switching element and said lower semiconductor switching element, wherein said controller controls an absolute value of said second control voltage so as to reach a mean voltage lower than an absolute value of a threshold voltage of said lower semiconductor switching element and higher than a ground voltage, said threshold voltage being a minimum gate-source voltage needed to switch on the lower semiconductor switching element, and keeps applying said mean voltage to said second control terminal during a transition period that begins before a logical transition of the first control voltage between "H" level and "L" level, and ends after the logical transition of the first control voltage between "H" level and "L" level.

2. The semiconductor device according to claim 1, further comprising a first diode connected in parallel with said lower semiconductor switching element and with its forward direction to said node.

3. The semiconductor device according to claim 2, wherein said lower semiconductor switching element is an n-type MOS transistor, said n-type MOS transistor having a parasitic diode serving as said diode.

4. The semiconductor device according to claim 3, further comprising a second diode connected in parallel with said upper semiconductor switching element and with its forward direction from said node to another terminal, wherein said upper semiconductor switching element is an n-type MOS transistor.

5. The semiconductor device according to claim 4, wherein said n-type MOS transistor has a parasitic diode serving as said second diode.

6. The semiconductor device according to claim 1, wherein said upper semiconductor switching element comprises a p-type MOS transistor.

7. The semiconductor device according to claim 1, wherein said upper semiconductor switching element is a bipolar transistor.

8. The semiconductor device according to claim 1, wherein said mean voltage is lower than said threshold voltage by a margin determined in consideration of factors such as fluctuations in noise.

9. The semiconductor device according to claim 1, wherein the absolute value of said second control voltage is set to a voltage higher than the absolute value of said threshold voltage of said lower semiconductor switching element when said upper semiconductor switching element is in the non-conductive state, and said second control voltage is set to said ground voltage when said upper semiconductor switching element is in the conductive state, before and after said transition period.

10. The semiconductor device according to claim 1, wherein the absolute value of said second control voltage is set to a voltage higher than the absolute value of said threshold voltage of said lower semiconductor switching element when said upper semiconductor switching element is in the non-conductive state, and the absolute value of said second control voltage is set to said mean voltage when said upper semiconductor switching element is in the conductive state, before and after said transition period.

11. The semiconductor device according to claim 1, wherein said controller controls the absolute value of said second control voltage so as to reach said mean voltage during a transition period present before and after the time of transition from the conductive state to the non-conductive state of said upper semiconductor switching element, and the absolute value of said second control voltage so as to reach said ground voltage during a transition period present before and after the time of transition from the non-conductive state to the conductive state of said upper semiconductor switching element.

12. The semiconductor device according to claim 1, wherein said controller holds said second control voltage at said mean voltage during said transition period and periods present before and after said transition period.

13. The semiconductor device according to claim 1, wherein said mean voltage is held at a certain value during said transition period.

14. The semiconductor device according to claim 1, wherein said mean voltage rises or falls at a certain gradient during said transition period.

15. The semiconductor device according to claim 1, further comprising a temperature detector operative to detect a temperature at said lower semiconductor switching element, wherein said controller controls the level of said mean voltage based on a detected output provided from said temperature detector.

16. The semiconductor device according to claim 15, wherein said controller controls the level of said mean voltage to lower when said temperature detector detects an elevation in temperature.

17. The semiconductor device according to claim 1, further comprising an inductor having one end connected to said node and the other end connected to a load.

18. The semiconductor device according to claim 17, further comprising a smoothing capacitor connected to the other end of said inductor.

19. The semiconductor device according to claim 1, wherein said controller controls the absolute value of said second control voltage so as to reach said mean voltage, during a transition period present before and after the time of transition from the conductive state to the non-conductive state of said upper semiconductor switching element, and controls the absolute value of said second control voltage so as to reach said mean voltage, during a transition period present before and after the time of transition from the non-conductive state to the conductive state of said upper semiconductor switching element.

20. The semiconductor device according to claim 19, wherein the absolute value of said second control voltage is set to a voltage higher than the absolute value of said threshold voltage of said lower semiconductor switching element when said upper semiconductor switching element is in the non-conductive state, and said second control voltage is set to said ground voltage when said upper semiconductor switching element is in the conductive state, before and after said transition period.

* * * * *